United States Patent
Mustafa et al.

(10) Patent No.: US 12,305,284 B2
(45) Date of Patent: May 20, 2025

(54) APPARATUS AND METHODS FOR FINE PLANAR NON-UNIFORMITY IMPROVEMENT

(71) Applicant: Applied Materials, Inc., Santa Clara, CA (US)

(72) Inventors: Muhannad Mustafa, Milpitas, CA (US); Mario D. Silvetti, Fountain Hills, AZ (US); Mandyam Sriram, San Jose, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 649 days.

(21) Appl. No.: 17/522,629

(22) Filed: Nov. 9, 2021

(65) Prior Publication Data

US 2023/0146837 A1 May 11, 2023

(51) Int. Cl.
*F28F 3/12* (2006.01)
*C23C 16/46* (2006.01)
*F28F 21/08* (2006.01)

(52) U.S. Cl.
CPC ............... *C23C 16/46* (2013.01); *F28F 3/12* (2013.01); *F28F 21/083* (2013.01); *F28F 21/084* (2013.01); *F28F 2225/00* (2013.01)

(58) Field of Classification Search
CPC ............ C23C 16/4581; C23C 16/4586; C23C 16/481; H01J 37/32715; H01J 37/32724; H01L 21/67103; H01L 21/67115; H01L 21/68757; H01L 21/68785; F28F 3/12; F28F 2225/00

See application file for complete search history.

(56) References Cited

U.S. PATENT DOCUMENTS

| | | | |
|---|---|---|---|
| 5,766,426 A | 6/1998 | Clarke | |
| 5,981,388 A | 11/1999 | Miyamoto | |
| 6,485,603 B1 * | 11/2002 | Yee | H01L 21/67115 156/345.48 |
| 10,626,499 B2 | 4/2020 | Lo et al. | |
| 2006/0144336 A1 * | 7/2006 | Um | C23C 16/46 156/345.52 |
| 2017/0107619 A1 * | 4/2017 | Lo | C23C 16/46 |
| 2022/0333239 A1 * | 10/2022 | Saurabh | H01J 37/32724 |

FOREIGN PATENT DOCUMENTS

EP 2402108 A1 1/2012

* cited by examiner

*Primary Examiner* — Steven S Anderson, II
*Assistant Examiner* — Michael James Giordano
(74) *Attorney, Agent, or Firm* — SERVILLA WHITNEY LLC

(57) ABSTRACT

Pedestal heater radiators, pedestal assemblies including the pedestal heater radiators and methods of decreasing deposition non-uniformity are described. The pedestal heater radiator has a first radiator body and a second radiator body with different emissivities. The first radiator body and second radiator body are sized and positioned to decrease the heat loss differential between sides of the pedestal.

12 Claims, 5 Drawing Sheets

APPARATUS AND METHODS FOR FINE PLANAR NON-UNIFORMITY IMPROVEMENT

TECHNICAL FIELD

Embodiments of the disclosure generally relate to apparatus and methods for improving deposition non-uniformity. In particular, embodiments of the disclosure pertain to apparatus and methods to decrease the non-uniformity of deposited films due to temperature non-uniformity of the substrate.

BACKGROUND

In the field of semiconductor processing, flat-panel display processing or other electronic device processing, vapor deposition processes have played an important role in depositing materials on substrates. With smaller technology nodes, on-wafer process uniformity becomes more stringent, having a larger impact on the formation of usable devices.

Most of the chemical vapor deposition (CVD) and atomic layer deposition (ALD) chambers are thermally asymmetric due, at least in part, to having a slit valve at one side of the chamber and an exhaust at the other side. The slit valve area is typically colder than the exhaust area and thermal loss from the wafer are correlated with these temperature differences.

The overall deposition non-uniformity in a process chamber results from a combination of several sources; radial non-uniformity, planar non-uniformity and residual non-uniformity. Radial non-uniformity generally appears as a somewhat symmetric pattern with the center of the wafer having a different thickness than the edges of the wafer. Planar non-uniformity occurs in a pattern across the wafer surface with one edge of the wafer having a different thickness than the opposite edge. The temperature gradient over the wafer surface has a planar non-uniformity impact on thickness of the film being deposited. Planar non-uniformity, while not as significant as radial non-uniformity, becomes a substantial concern to the semiconductor chip making industries for the N3 or beyond node for upcoming next generation microprocessors.

Accordingly, there is a need in the art for apparatus and methods for improving the planar temperature uniformity.

SUMMARY

One or more embodiments of the disclosure are directed to pedestal heater radiators comprising a first radiator body and a second radiator body. The first radiator body comprises a central clamping portion and an outer peripheral portion. The first radiator body has a top surface and a bottom surface defining a thickness. The first radiator body comprises a first material having a first emissivity. The second radiator body is connected to a portion of the first radiator body by at least two connection points. The second radiator body has a top surface and a bottom surface defining a thickness. The second radiator body comprises a second material having a second emissivity different from the first emissivity.

Additional embodiments of the disclosure are directed to pedestal assemblies comprising a heater and a pedestal heater radiator. The heater is positioned on a top end of a pedestal shaft and has a support surface and a bottom surface defining a thickness of the heater. The pedestal heater radiator comprises a first radiator body and a second radiator body. The first radiator body comprises a central clamping portion and an outer peripheral portion. The first radiator body has a top surface and a bottom surface defining a thickness. The first radiator body comprises a first material having a first emissivity. The second radiator body is connected to a portion of the first radiator body by at least two connection points. The second radiator body has a top surface and a bottom surface defining a thickness. The second radiator body comprises a second material having a second emissivity different from the first emissivity. The pedestal heater radiator is positioned along the length of the pedestal shaft and spaced a distance from the bottom surface of the heater.

Further embodiments of the disclosure are directed to methods of decreasing film thickness non-uniformity. A size of a first radiator body having a first emissivity and a second radiator body having a second emissivity are determined. The first radiator body is assembled with the second radiator body by connecting at least one connection tab on the second radiator body to at least one connection hub on the first radiator body to form a single component radiator body. The single component radiator body is positioned adjacent a bottom surface of a heater positioned on a top end of the pedestal shaft.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
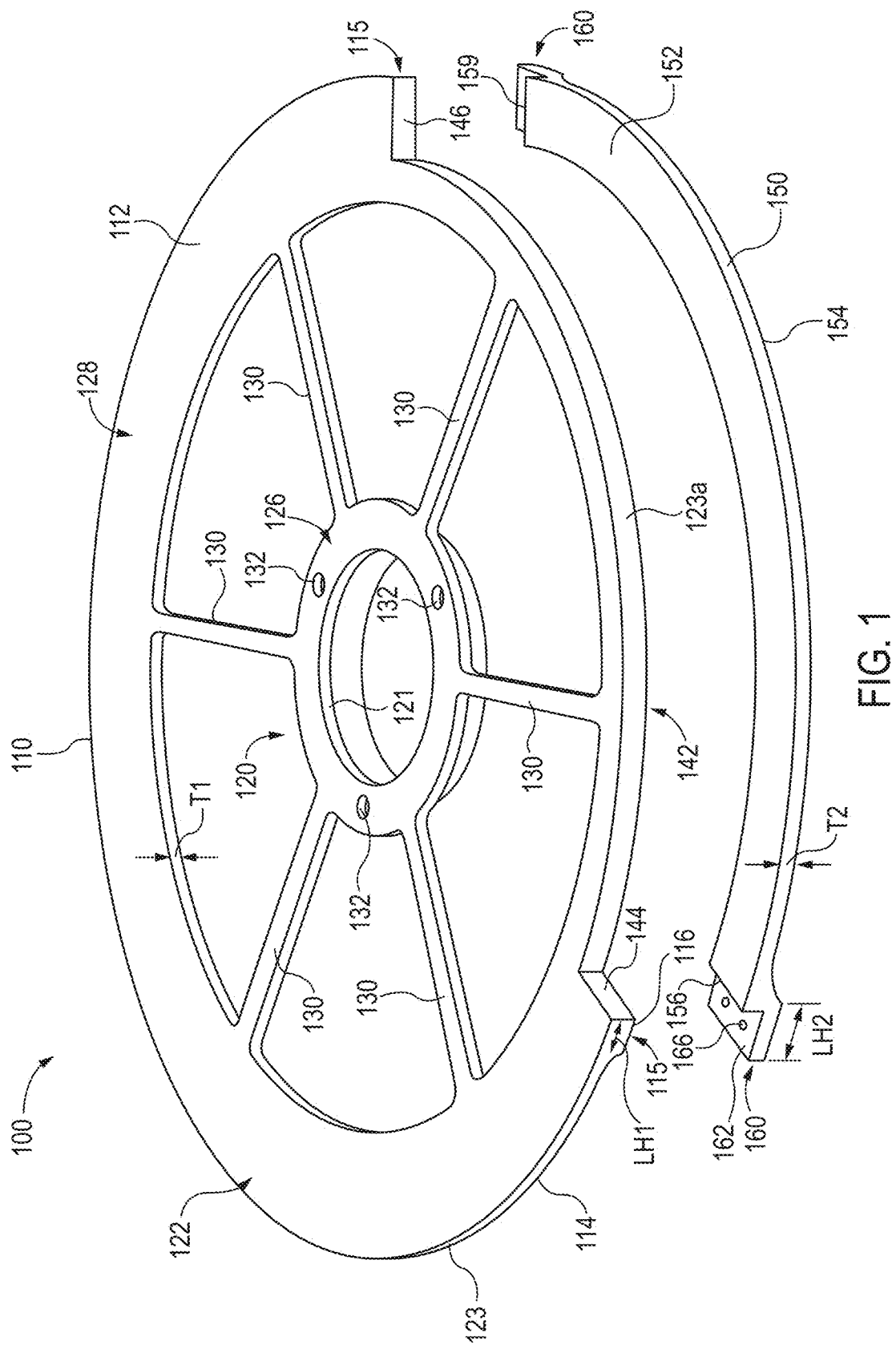
FIG. 1 shows a view of a pedestal heater radiator in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

Embodiments of the disclosure provide new techniques to improve film thickness non-uniformity on the wafer side-to-side. The side-to-side uniformity is referred to as planar uniformity. Some embodiments advantageously provide techniques with less dependence on the surface emissivity to achieve consistent uniformity for extended process times. Some embodiments advantageously provide low-cost solutions to planar non-uniformity issues with fine tunability. Some embodiments allow for tuning planar non-uniformity in multiple zones.

One or more embodiments of the disclosure provide techniques using a heater backside radiator as an indirect heat source to alter radiation loss from the heater backside. Based on types of materials, surface temperatures of the radiator will vary and radiation heat transfer from the pedestal to the radiator can be tuned. Process burn-in can minimize the non-uniformity drift over time at extended runs. Some embodiments prevent relative heat loss between the wafer sides, enabling improved control over the process film thickness and/or improve planar non-uniformity. Some embodiments of the disclosure address planar non-uniformity to improve film thickness uniformity at the atomic scale.

Referring to FIG. 1, one or more embodiments of the disclosure are directed to pedestal heater radiators 100. The radiator 100 comprises a first radiator body 110 and a second radiator body 150. While two radiator bodies are illustrated in the Figures, the skilled artisan will recognize that there can be more than two radiator bodies.

The first radiator body 110 has a top surface 112 and a bottom surface 114 that define a thickness T1 of the first radiator body 110. The first radiator body 110 includes a central clamping portion 120 and an outer peripheral portion 122. The central clamping portion 120 has in inner peripheral face 121 and the outer peripheral portion 120 of the first radiator body 110 has an outer peripheral face 123.

The first radiator body 110 comprises a first material having a first emissivity. The skilled artisan will understand that emissivity refers to the amount of energy emitted from the material surface as thermal radiation. The first material can be any suitable material including, but not limited to, aluminum, stainless steel, aluminum nitride, quartz or aluminum oxide.

In the embodiment illustrated in FIG. 1, the central clamping portion 120 of the first radiator body 110 comprises a center ring 126 and the outer peripheral portion 122 comprises an outer ring 128. The center ring 126 is connected to the outer ring 128 by a plurality of spokes 130. In the embodiment illustrated, there are six spokes 130. However, the skilled artisan will recognize that there can be more or less than six spokes 130. In some embodiments, the first radiator body 110 has no spokes 130 so that a disc of the first material is formed without a separate center ring 126 and outer ring 128. In a disc-shaped radiator body, the outer ring 128 refers to the portion of the disc-shaped body adjacent the outer peripheral edge 123.

The center ring 126 of some embodiments comprises a plurality of openings 132. The number of openings 132 can be any suitable number and is not limited to the number of openings 132 shown in the Figures. The plurality of openings 132 of some embodiments, are configured to allow a fastener 140, shown in FIG. 2, to pass through the first radiator body 110. The fastener 140 can be any suitable fastener known to the skilled artisan including, but not limited to, bolts and screws.

The outer ring 128 of some embodiments includes an inset portion 142. The inset portion 142 forms an outer peripheral recess where the outer peripheral edge 123a is closer to the center ring 126 than the outer peripheral edge 123 outside of the inset portion 142. The inset portion 142 has a length measured along the arc segment formed by the first end face 144 and second end face 146. The length of the inset portion 142 can be any suitable length. In some embodiments, the length of the inset portion 142 is measured as an angle. For example, in some embodiments, the length of the inset portion 142 is less than or equal to 210°, 195°, 180°, 165°, 150°, 135°, 120°, 105°, 90° or 75°. The width of the inset portion 142, measured from the outer peripheral face 123 to the outer peripheral edge 123a, is in the range of 1 mm to 100 mm, or in the range of 5 mm to 75 mm, or in the range of 10 mm to 50 mm.

The second radiator body 150 has a top surface 152 and a bottom surface 154 defining a thickness T2 of the second radiator body 150. The second radiator body 150 comprises a second material having a second emissivity different from the first emissivity of the first material. The second material can be any suitable material known to the skilled artisan including, but not limited to, aluminum and stainless steel. The first material and second material can be selected to control the overall emissivity of the pedestal heater radiator 100. In some embodiments, the first material of the radiator body 110 comprises aluminum and the second material of the second radiator body 150 comprises stainless steel.

The second radiator body 150 has a complementary shape to the inset portion 142 of the outer ring 128 of the first radiator body 110. The inset portion 142 of some embodiments is an arcuate shaped cutout in the outer ring 128 and the second radiator body 150 is arcuate shaped to fit within the arcuate shaped cutout.

The second radiator body 150 has a length defined by a first end 156 and 158. The length of the second radiator body 150 of some embodiments is equal to or slightly less than the length of the inset portion 142. In some embodiments, the length of the second radiator body 150 is at least 0.1 mm less than the length of the inset portion 142. The thickness T2 of the second radiator body 150 is measured along the middle portion of the second radiator body 150 away from any connection tab 160, as described below. The length of the second radiator body 150 is measured between the faces of the second radiator body that fit within the inset portion 142 and do not include any length associated with a connection tab 160, as described below.

The outer ring 128 of the first radiator body 110 of some embodiments includes at least one connection hub 115. In the embodiment illustrated in FIG. 1, the first radiator body 110 includes two connection hubs 115 located at either end of the inset portion 142. The second radiator body 150 comprises at least one connection tab 160 positioned to cooperatively interact with the at least one connection hub 115 of the first radiator body 110. In the embodiment illustrated in FIG. 1, there are two connection tabs 160 positioned at opposite ends of the second radiator body 150. The connection tabs 160 extend a distance (length $L_{H2}$) from the first end 156 and second end 158 of the second radiator body 150.

Figure 2:
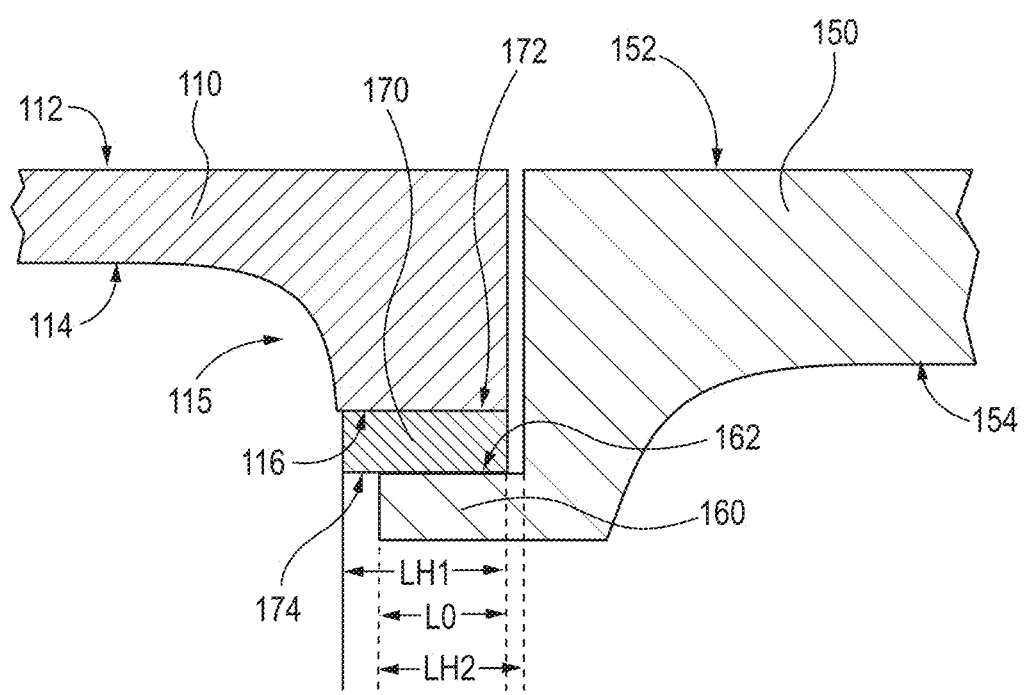
FIG. 2 shows an expanded view of a portion of a pedestal heater radiator in accordance with one or more embodiment of the disclosure.

Referring to FIGS. 1 and 2, the connection tabs 160 include a top surface 162 configured to overlap at least a portion of the bottom surface 116 of the connection hub 115 of the first radiator body 110. The size of the overlap $L_O$ between the connection tab 160 and the connection hub 115 is variable to change contact resistance between the first radiator body 110 and the second radiator body 150. Stated differently, the length $L_{H1}$ of the connection hub 115 of the first radiator body 110 and the length $L_{H2}$ of the connection tab 160 of the second radiator body 150 can be varied to change the amount of overlap $L_O$ between the connection hubs and tabs, and change the thermal coupling between the first radiator body 110 and the second radiator body 150. In some embodiments, the amount of overlap LO is less than or equal to 1.5 inches, 1.25 inches, 1 inch, 0.75 inches, 0.5 inches, 0.25 inches, 35 mm, 30 mm, 25 mm, 20 mm, 15 mm, 10 mm or 5 mm.

In some embodiments, as shown in FIG. 1, an intermediate contact body 170 is positioned between the top surface 162 of the connection tab 160 of the second radiator body 150 and the bottom surface 116 of the connection hub 115 of the first radiator body 110. The intermediate contact body 170 can be any suitable material of any suitable thickness. In some embodiments, the intermediate contact body 170 changes the contact resistance between the first radiator body and the second radiator body. In some embodiments, the intermediate contact body 170 is made of a third material having a third emissivity. The third emissivity of some embodiments is different than one or more of the first emissivity or second emissivity. In some embodiments, the third material cushions the contact between the first radiator body 110 and the second radiator body 150 to prevent formation of particulates as the radiator 100 is heated within the processing chamber.

In some embodiments, as shown in FIG. 2, the top surface 112 of the first radiator body 110 is substantially coplanar with the top surface 152 of the second radiator body 150. As used in this manner, the term "substantially coplanar" means that the plane formed by the top surface 112 of the first radiator body 110 is within ±0.5 mm, ±0.2 mm or ±0.1 mm of coplanarity. In some embodiments, the top surface 112 of the first radiator body 110 and the top surface 152 of the second radiator body 150 are not coplanar.

Figure 3:
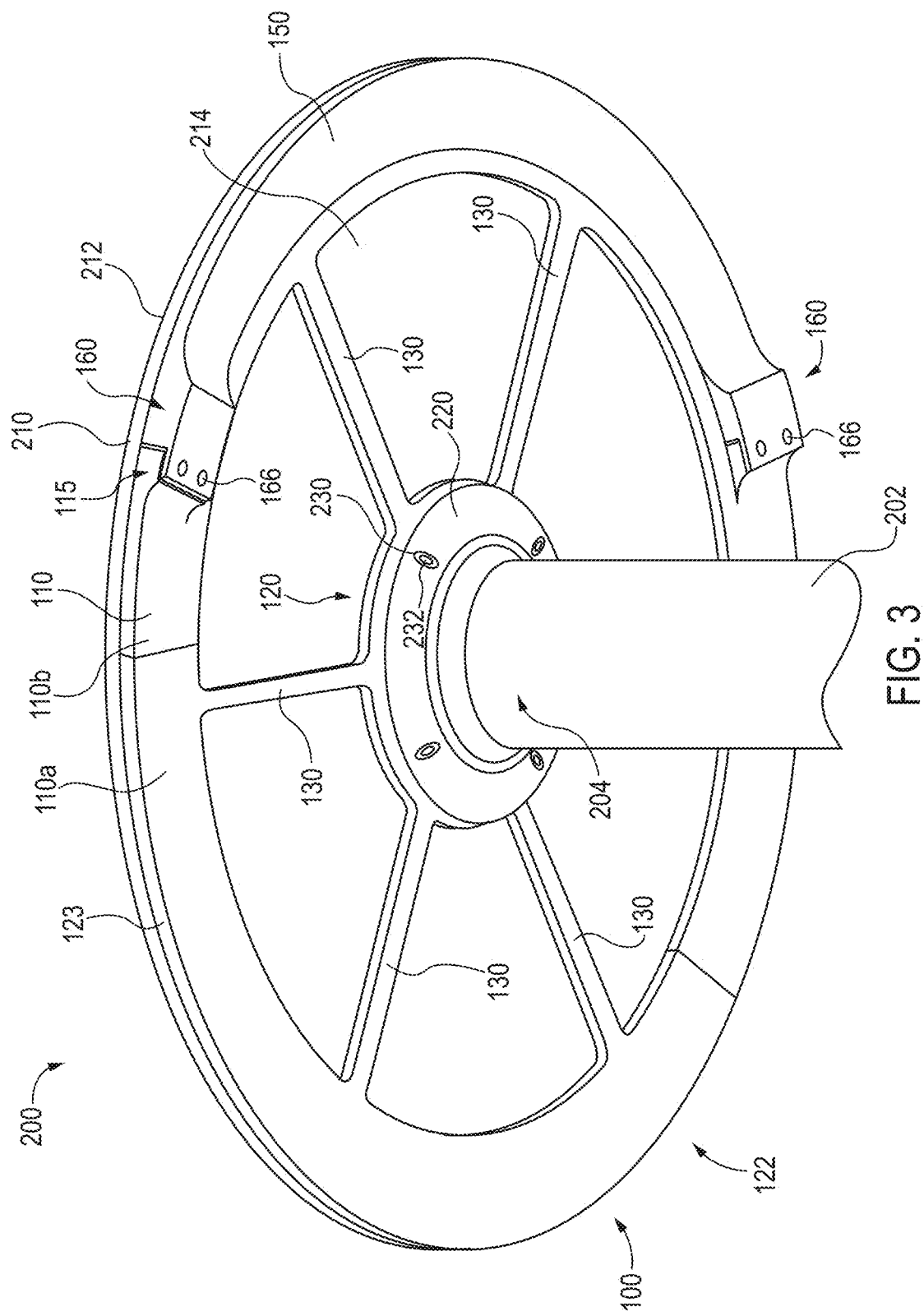
FIG. 3 shows a bottom view of a pedestal assembly including a pedestal heater radiator in accordance with one or more embodiment of the disclosure.
Figure 4:
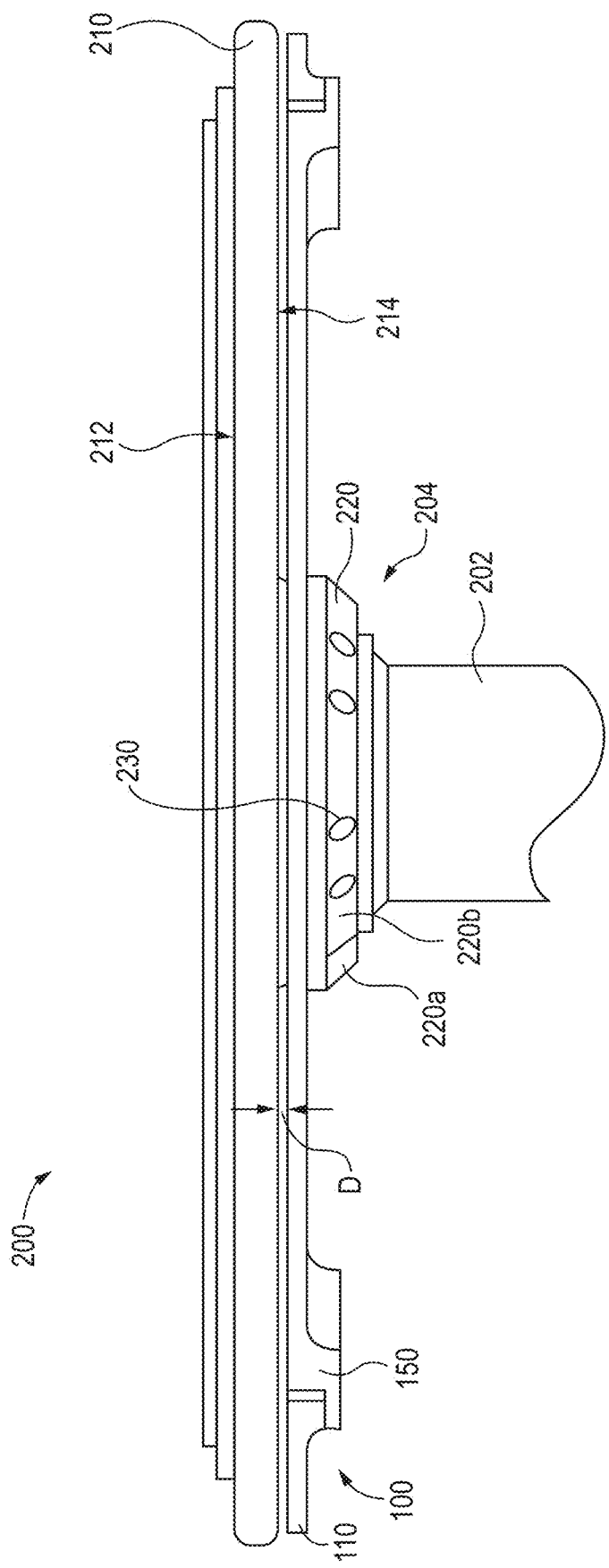
FIG. 4 shows a side view of a pedestal assembly including a pedestal heater radiator and clamp in accordance with one or more embodiment of the disclosure.

Referring to FIGS. 3 and 4, one or more embodiments of the disclosure are directed to pedestal assemblies 200. The pedestal assemblies 200 comprise a heater 210 on a top 204 of a pedestal shaft 202. The heater 210 has a support surface 212 and a bottom surface 214 that define the thickness of the heater 210. The pedestal heater radiator 100 is positioned along the length of pedestal shaft 202 and is spaced a distance D from the bottom surface 214 of the heater 210.

The distance D between the pedestal heater radiator 100 and the bottom surface 214 of the heater 210 can be tuned to allow for a decrease in temperature non-uniformity. In some embodiments, the distance D is in the range of 0.5 mm to 2.5 mm, or in the range of 0.75 mm to 2.25 mm, or in the range of 1 mm to 2 mm, or in the range of 1.25 mm to 1.75 mm.

The pedestal heater radiator 100 is maintained at a fixed position along the length of the shaft 202 using a clamp 220. The clamp 220 is positioned around the pedestal shaft 202 and configured to cooperatively interact with the central clamping portion 120 of the pedestal heater radiator 100 at the distance D from the bottom surface 214 of the heater 210.

In some embodiments, as shown in FIG. 3, the first radiator body 110 is split into a first radiator body part 110a and a second radiator body part 110b that can be positioned around the shaft 202 below the heater 210. In embodiments of this sort, the first radiator body part 110a and second radiator body part 110b are connected together using a suitable fastener. The split body pedestal heater radiator 100 can be positioned on a pedestal without removing the heater, making it easier to retrofit to existing systems.

The clamp 220 of some embodiments is a split body that can be positioned around the shaft 202. As shown in FIG. 4, the split body of the clamp 220 is separated into a first clamp body 220a and a second clamp body 220b that combine to form the clamp 220. The clamp 220 can be connected to the pedestal heater radiator 100 through openings 230 using fasteners 232. The fasteners 232 can be any suitable fasteners known to the skilled artisan. In some embodiments, at least some of the openings 230 are aligned to allow the first clamp body 220a and the second clamp body 220b to be connected together using a suitable fastener.

Figure 5:
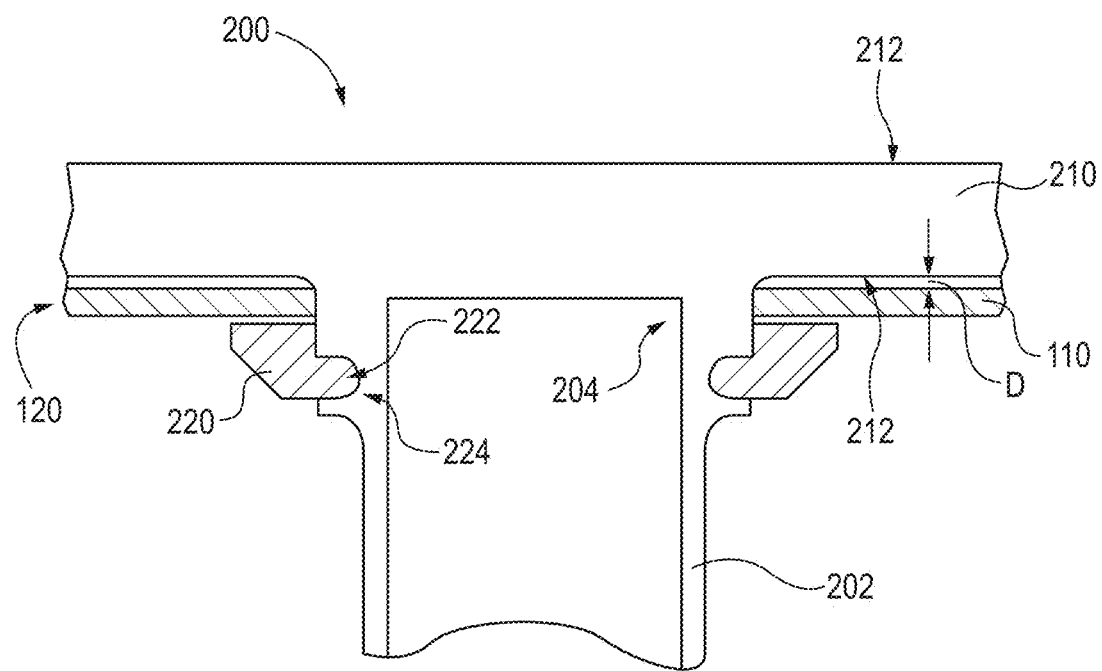
FIG. 5 shows a partial cross-sectional view of a pedestal assembly including a heater radiator and clamp in accordance with one or more embodiment of the disclosure.

FIG. 5 shows a partial cross-sectional view of an embodiment of a pedestal assembly 200 including the pedestal heater radiator 100 and clamp 220. In the illustrated embodiment, the clamp 220 includes a protrusion 222 that cooperatively interacts with a complementary recess 224 in the shaft 202. In embodiments of this sort, the position of the clamp 220 is fixed and control of the distance D between the pedestal heater radiator 100 and the bottom surface 214 of the heater 210 is based on the thickness of the first radiator body 110 and second radiator body 150.

Referring back to FIG. 1, in some embodiments, the second radiator body 150 is connected to the first radiator body 110 using a suitable fastener through openings 166. In some embodiments, the second radiator body 150 is removable from the first radiator body 110 and can be replaced with a different second radiator body 150 with a different thickness and/or emissivity.

Additional embodiments of the disclosure are directed to methods of decreasing film thickness non-uniformity. A size of a first radiator body 110 and second radiator body 150 is determined. The sizes of the first radiator body 110 and second radiator body 150 include the radius and/or thicknesses of the materials where the first radiator body 110 has a first emissivity and the second radiator body 150 has a second emissivity.

The first radiator body 110 is assembled with the second radiator body 150 by connecting at least one connection tab 160 on the second radiator body 150 to at least one connection hub 115 on the first radiator body 100 to form a single component radiator body 100. The single component radiator body is positioned adjacent a bottom surface of a heater 214 positioned at a top end 204 of a pedestal shaft 202. In some embodiments, the single component radiator body is clamped into positioned at a fixed distance from the bottom surface of the heater 210 using a clamp 220 configured to interact with the central clamping portion 120 of the first radiator body 110.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A pedestal heater radiator comprising:
a first radiator body comprising a central clamping portion and an outer peripheral portion, the first radiator body having a top surface and a bottom surface defining a thickness, the first radiator body comprising a first material having a first emissivity, the central clamping portion of the first radiator body comprising a center ring and the outer peripheral portion comprising an outer ring, the center ring connected to the outer ring by a plurality of spokes, the outer ring having an inset portion forming an outer peripheral recess, the inset portion comprising an arcuate shaped cutout in the outer ring, and two connection hubs adjacent the inset portion positioned on opposite sides of the arcuate shaped cutout along an outer peripheral edge of the first radiator body; and
a second radiator body connected to a portion of the first radiator body by at least two connection points, the second radiator body having a top surface and a bottom surface defining a thickness, the second radiator body comprising a second material having a second emissivity different from the first emissivity, and the second radiator body arcuate shaped to fit within the arcuate shaped cutout in the outer ring.

2. The pedestal heater radiator of claim 1, wherein the center ring comprises a plurality of openings configured to allow a fastener to pass through the first radiator body.

3. The pedestal heater radiator of claim 1, wherein the second radiator body comprises at least one connection hub positioned to cooperatively interact with the at least one connection hub.

4. The pedestal heater radiator of claim 1, wherein the second radiator body comprises two connection tabs positioned on ends of the second radiator body and aligned to cooperatively interact with the two connection hubs.

5. The pedestal heater radiator of claim 1, wherein the top surface of the first radiator body and the top surface of the second radiator body are substantially coplanar.

6. The pedestal heater radiator of claim 1, wherein the top surface of the second radiator body is not coplanar with the top surface of the first radiator body.

7. The pedestal heater radiator of claim 1, wherein the first radiator body comprises aluminum and the second radiator body comprises stainless steel.

8. A pedestal assembly comprising:
a heater positioned on a top end of a pedestal shaft, the heater having a support surface and a bottom surface defining a thickness of the heater; and
the pedestal heater radiator of claim 1 positioned along a length of the pedestal shaft and spaced a distance from the bottom surface of the heater.

9. The pedestal heater radiator of claim 4, wherein the connection tab has a top surface configured to overlap a bottom surface of the connection hub.

10. The pedestal heater radiator of claim 9, wherein the size of the overlap between the connection tab and the connection hub is variable to change contact resistance between the first radiator body and the second radiator body.

11. The pedestal heater radiator of claim 9, further comprising an intermediate contact body positioned between the top surface of the connection tab and the bottom surface of the connection hub to change contact resistance between the first radiator body and the second radiator body.

12. The pedestal assembly of claim 8, further comprising a clamp positioned around the pedestal shaft and configured to cooperatively interact with the central clamping portion of the pedestal heater radiator to hold the pedestal heater radiator at the distance from the bottom surface of the heater.

* * * * *